(12) United States Patent
Uejima

(10) Patent No.: US 10,383,211 B2
(45) Date of Patent: Aug. 13, 2019

(54) FRONT-END CIRCUIT AND HIGH-FREQUENCY MODULE

(71) Applicant: Murata Manufacturing Co., Ltd., Kyoto (JP)

(72) Inventor: Takanori Uejima, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/144,421

(22) Filed: Sep. 27, 2018

(65) Prior Publication Data

US 2019/0029109 A1 Jan. 24, 2019

Related U.S. Application Data

(63) Continuation of application No. PCT/JP2017/008871, filed on Mar. 7, 2017.

(30) Foreign Application Priority Data

Mar. 31, 2016 (JP) ................... 2016-071022

(51) Int. Cl.
*H04B 1/38* (2015.01)
*H05K 1/02* (2006.01)
(Continued)

(52) U.S. Cl.
CPC ........... *H05K 1/0216* (2013.01); *H01L 23/00* (2013.01); *H04B 1/00* (2013.01); *H04B 1/38* (2013.01);
(Continued)

(58) Field of Classification Search
CPC ........... H01L 23/00; H01L 2924/15311; H01L 2924/19105; H04B 1/00; H04B 1/40;
(Continued)

(56) References Cited

U.S. PATENT DOCUMENTS 8,294,535 B2* 10/2012 Feiertag ................. H03H 9/059
333/187
10,171,059 B2* 1/2019 Hino ....................... H01L 25/00
(Continued)

FOREIGN PATENT DOCUMENTS

JP  H10-107471 A  4/1998
JP  2001-244829 A  9/2001
(Continued)

OTHER PUBLICATIONS

International Search Report for International Application No. PCT/JP2017/008871 dated May 23, 2017.
(Continued)

*Primary Examiner* — Nhan T Le
(74) *Attorney, Agent, or Firm* — Pearne & Gordon LLP

(57) ABSTRACT

A front-end circuit includes an insulating substrate, a power amplifier, a receiver circuit device, and a shielding conductor. The power amplifier and the receiver circuit device are mounted on a top surface of the insulating substrate. The shielding conductor covers a part of the insulating substrate at the top surface side. A transmitter circuit region (Retx) where the power amplifier is mounted is arranged closer to a first side surface side than a second side surface. A receiver circuit region (Rerx) where the receiver circuit device is mounted is arranged between the transmitter circuit region (Retx) and the second side surface. The shielding conductor includes a top surface side conductor covering the transmitter circuit region (Retx) and a first side surface side conductor covering the first side surface side of the transmitter circuit region (Retx).

20 Claims, 9 Drawing Sheets

(51) Int. Cl.
*H01L 23/00* (2006.01)
*H04B 1/00* (2006.01)
*H04B 1/40* (2015.01)
*H05K 1/18* (2006.01)

(52) U.S. Cl.
CPC ............... *H04B 1/40* (2013.01); *H05K 1/182* (2013.01); *H01L 2924/15311* (2013.01); *H01L 2924/19105* (2013.01); *H05K 2201/0715* (2013.01); *H05K 2201/09036* (2013.01); *H05K 2201/10378* (2013.01); *H05K 2201/10522* (2013.01)

(58) Field of Classification Search
CPC ........ H04B 1/38; H05K 1/0243; H05K 1/182; H05K 1/0216; H05K 2201/0715; H05K 2201/09036; H05K 2201/10378; H05K 2201/10522; H05K 9/0071; H05K 9/0088
See application file for complete search history.

(56) References Cited

U.S. PATENT DOCUMENTS

2009/0091904 A1  4/2009  Hatanaka et al.
2017/0187098 A1*  6/2017  Ashida ................ G01S 3/00
2018/0204827 A1*  7/2018  Betsui ................. H01L 22/14

FOREIGN PATENT DOCUMENTS

JP   2007-294828 A   11/2007
WO   2010/103722 A1   9/2010

OTHER PUBLICATIONS

Written Opinion for International Application No. PCT/JP2017/008871 dated May 23, 2017.

\* cited by examiner

FRONT-END CIRCUIT AND HIGH-FREQUENCY MODULE

This is a continuation of International Application No. PCT/JP2017/008871 filed on Mar. 7, 2017 which claims priority from Japanese Patent Application No. 2016-071022 filed on Mar. 31, 2016. The contents of these applications are incorporated herein by reference in their entireties.

BACKGROUND OF THE DISCLOSURE

Field of the Disclosure

The present disclosure relates to high-frequency modules that transmit and receive communication signals in a plurality of communication bands and front-end circuits that constitute the high-frequency modules.

Description of the Related Art

Patent Document 1 describes a circuit module. A circuit board includes a wiring board and a plurality of electronic components such as semiconductor devices and the like. The plurality of electronic components is mounted on a surface of the wiring board.

On a surface of the wiring board, a resin layer is formed. The resin layer covers a plurality of electronic components. On a top surface of the resin layer, a conductor layer (shielding electrode) is formed.

Patent Document 1: Japanese Unexamined Patent Application Publication No. 2007-294828

BRIEF SUMMARY OF THE DISCLOSURE

A high-frequency module utilizing a plurality of communication bands includes a plurality of front-end circuits each of which is used for a different communication band. Further, in some cases, each of the plurality of front-end circuits is constituted by an individual circuit board.

With such configuration, in some cases, it is necessary to closely arrange a first circuit board for use in communication in a first communication band which is a relatively low frequency band and a second circuit board for use in communication in a second communication band which is a relatively high frequency band. Particularly, with recent downsizing of cellular phone terminals, there are more cases where the first circuit board and the second circuit board are needed to be closely arranged.

In such cases, in the configuration of the circuit board described in the patent document 1, harmonic signals (unwanted signals) of the first communication band sometimes leaks from the first circuit board to the second circuit board. Here, for example, in a case where harmonic signals (unwanted signals) of the first communication band overlap or close to a frequency range of the second communication band, there is an adverse effect on transmission and reception characteristics (particularly, on reception characteristics) of the second communication band.

Accordingly, an object of the present disclosure is to provide a front-end circuit and a high-frequency module that are capable of suppressing degradation of transmission and reception characteristics due to leakage of an unwanted signal among a plurality of communication bands.

The present disclosure is a front-end circuit including a transmitter circuit and a receiver circuit and has the following configuration. The front-end circuit includes an insulating substrate, a conductor pattern, a transmitter circuit device, a receiver circuit device, and a shielding conductor. The insulating substrate has a top surface, a bottom surface, a first side surface, and a second side surface. The transmitter circuit device is mounted on a top surface of the insulating substrate and constitutes a part of the transmitter circuit. The receiver circuit device is mounted on the top surface of the insulating substrate and constitutes a part of the receiver circuit. The shielding conductor covers a part of the insulating substrate at a top surface side. In the top surface, a transmitter circuit region where the transmitter circuit device is mounted is arranged closer to a first side surface side than the second side surface. In the top surface, a receiver circuit region where the receiver circuit device is mounted is arranged between the transmitter circuit region and the second side surface. The shielding conductor includes at least one of a top surface side conductor overlapping with the transmitter circuit region in a plan view and a first side surface side conductor overlapping with the first side surface side of the transmitter circuit region in a side view, and has a shape that does not overlap the receiver circuit region in a plan view and does not overlap a second side surface side of the receiver circuit region in a side view.

This configuration suppresses radiation of unwanted signals to outside (suppresses influence on the outside) even in a case where the unwanted signals are radiated from the transmitter circuit device. Further, unwanted coupling among the transmitter circuit device, the receiver circuit device, and the shielding conductor is suppressed.

Further, in the front-end circuit of the present disclosure, the shielding conductor preferably includes both the top surface side conductor and the first side surface side conductor.

This configuration further suppresses radiation of unwanted signals to outside.

Further, in the front-end circuit of the present disclosure, it is preferable that the insulating substrate includes a third side surface and a fourth side surface that are orthogonal to the first side surface and the second side surface, and that the shielding conductor includes at least one of a third side surface side conductor covering a third side surface side of the transmitter circuit region and a fourth side surface side conductor covering a fourth side surface side of the transmitter circuit region.

This configuration further suppresses radiation of unwanted signals to outside.

Further, the front-end circuit of the present disclosure may have the following configuration. A part of the transmitter circuit is constituted by a transmitter circuit conductor pattern formed on the insulating substrate. A part of the receiver circuit is constituted by a receiver circuit conductor pattern formed on the insulating substrate. The transmitter circuit conductor pattern is formed inside the insulating substrate and includes a transmitter side ground conductor to be connected to the transmitter circuit device. The receiver circuit conductor pattern is formed inside the insulating substrate and includes a receiver side ground conductor to be connected to the receiver circuit device. The transmitter side ground conductor overlaps with the transmitter circuit region and does not overlap the receiver circuit region or the receiver side ground conductor in a plan view, and is not connected to the receiver side ground conductor within the insulating substrate and is connected to the shielding conductor.

This configuration further suppresses radiation of unwanted signals to outside. Further, unwanted coupling between the transmitter circuit device and the receiver circuit device via the ground conductor is suppressed.

Further, in the front-end circuit of the present disclosure, the insulating substrate may include a depression on the first side surface side, and the shielding conductor may be arranged in such a way as to abut the depression.

This configuration ensures placement of the shielding conductor on the insulating substrate.

Further, the present disclosure is a front-end circuit including a transmitter circuit and a receiver circuit and has the following configuration. The front-end circuit includes an insulating substrate, a conductor pattern, a transmitter circuit device, a receiver circuit device, and a shielding conductor. The insulating substrate has a top surface, a bottom surface, a first side surface, and a second side surface. The transmitter circuit device is mounted on a top surface of the insulating substrate and constitutes a part of the transmitter circuit. The receiver circuit device is mounted on the top surface of the insulating substrate and constitutes a part of the receiver circuit. The shielding conductor covers a part of the insulating substrate at a top surface side. In the top surface, a transmitter circuit region where the transmitter circuit device is mounted is arranged closer to a first side surface side than the second side surface. In the top surface, a receiver circuit region where the receiver circuit device is mounted is arranged between the transmitter circuit region and the second side surface. The shielding conductor includes at least one of a top surface side conductor overlapping with the receiver circuit region in a plan view and a second side surface side conductor overlapping with a second side surface side of the receiver circuit region in a side view. The shielding conductor has a shape that does not overlap the transmitter circuit region in a plan view and does not overlap the first side surface side of the transmitter circuit region in a side view.

This configuration suppresses reaching of unwanted signals to the receiver circuit device (suppresses influence from outside) even in a case where unwanted signals propagate from outside. Further, unwanted coupling between the transmitter circuit device and the shielding conductor is suppressed.

Further, in the front-end circuit of the present disclosure, the shielding conductor preferably includes both the top surface side conductor and the second side surface side conductor.

This configuration further suppresses influence of unwanted signals from outside.

Further, the front-end circuit of the present disclosure may have the following configuration. The insulating substrate includes a third side surface and a fourth side surface that are orthogonal to the first side surface and the second side surface. The shielding conductor includes at least one of a third side surface side conductor covering a third side surface side of the receiver circuit region and a fourth side surface side conductor covering a fourth side surface side of the receiver circuit region.

This configuration further suppresses unwanted signals from outside.

Further, in the front-end circuit of the present disclosure, the insulating substrate may include a depression on the second side surface side, and the shielding conductor may be arranged in such a way as to abut the depression.

This configuration ensures placement of the shielding conductor on the insulating substrate.

Further, the present disclosure is a high-frequency module that performs transmission and reception in a first communication band and a second communication band, the second communication band having a certain communication frequency range, the first communication band having a communication frequency range that is lower than the communication frequency range of the second communication band, and has the following configuration. The frequency range of the first communication band is lower than the frequency range of the second communication band. The high-frequency module includes a first front-end unit that performs transmission and reception in the first communication band, a second front-end unit that performs transmission and reception in the second communication band, and a base substrate on which the first front-end unit and the second front-end unit are mounted in such a manner as to be adjacent to one another. The first front-end unit includes one of the front-end circuits described above.

This configuration suppresses leaking of harmonic signals (unwanted signals) of transmitting signals in the first communication band in the first front-end unit to the receiver circuit of the second front-end unit.

Further, in the high-frequency module of the present disclosure, the second front-end unit may include any one of the front-end circuits described above.

This configuration further suppresses leakage of harmonic signals (unwanted signals) from the transmitter circuit of the first front-end unit to the receiver circuit of the second front-end unit.

Further, in the high-frequency module of the present disclosure, the second front-end unit includes one of the front-end circuits described above, and a first side surface of a front-end circuit that constitutes the first front-end unit faces a first side surface of a front-end circuit that constitutes the second front-end unit.

This configuration further suppresses leakage of harmonic signals (unwanted signals) from the transmitter circuit of the first front-end unit to the receiver circuit of the second front-end unit.

Further, the present disclosure is a high-frequency module that performs transmission and reception in a first communication band and a second communication band, the second communication band having a certain communication frequency range, the first communication band having a communication frequency range that is lower than the communication frequency range of the second communication band, and has the following configuration. The frequency range of the first communication band is lower than the frequency range of the second communication band. The high-frequency module includes a first front-end unit that performs transmission and reception in the first communication band, a second front-end unit that performs transmission and reception in the second communication band, and a base substrate on which the first front-end unit and the second front-end unit are mounted in such a manner as to be adjacent to one another. Each of the first front-end unit and the second front-end unit includes one of the front-end circuits described above.

This configuration suppresses leaking of harmonic signals (unwanted signals) of transmitting signals in the first communication band in the first front-end unit to the receiver circuit of the second front-end unit.

The present disclosure enables to suppress the degradation of transmission and reception characteristics caused by at least one of unwanted signals in a plurality of communication bands.

DETAILED DESCRIPTION OF THE DISCLOSURE

Figure 1:
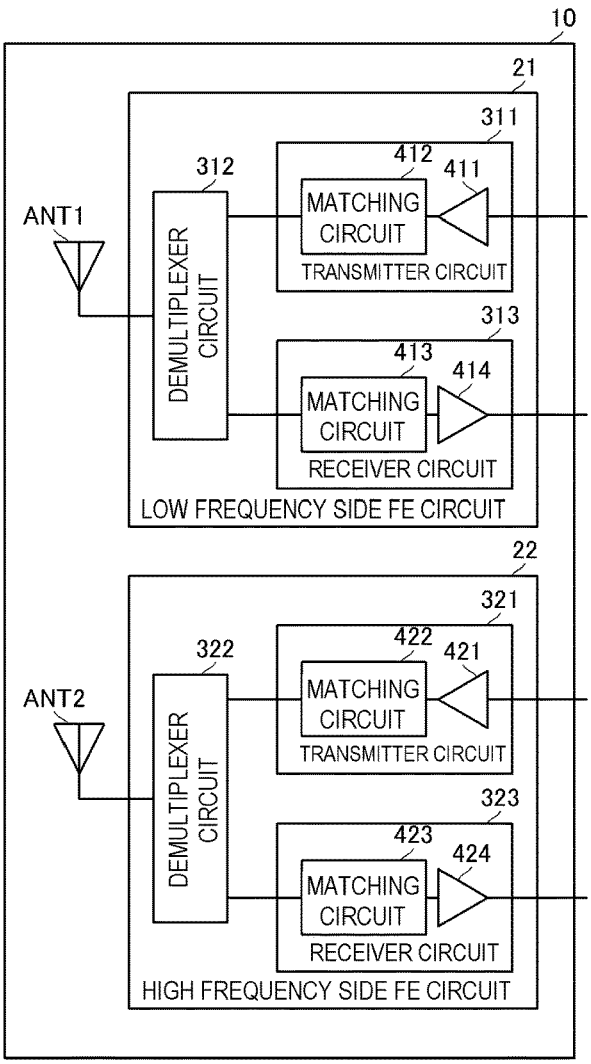
FIG. 1 is a circuit diagram illustrating a configuration of a high-frequency module according to a first embodiment of the present disclosure.
Figure 2:
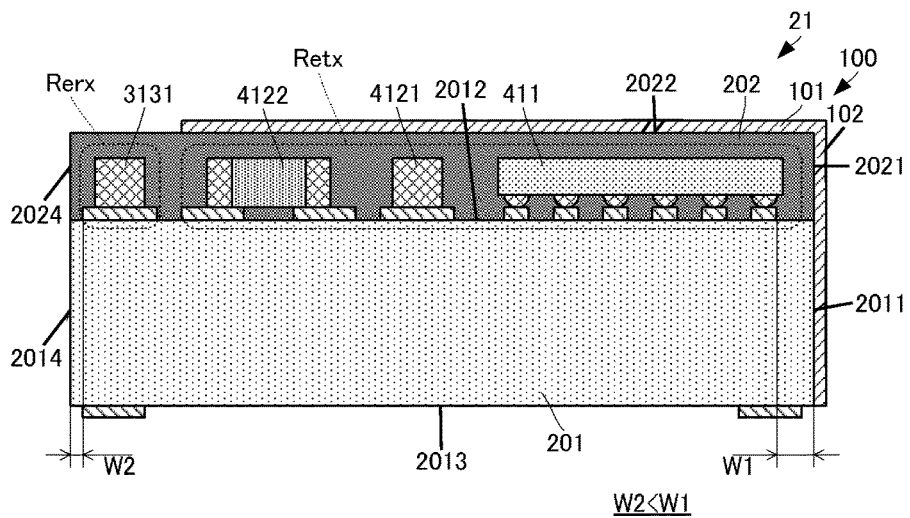
FIG. 2 is a front view illustrating a configuration of a front-end circuit according to the first embodiment of the present disclosure.

A front-end circuit and a high-frequency module according to the first embodiment of the present disclosure is described with reference to the drawings. FIG. 1 is a circuit diagram illustrating a configuration of a high-frequency module according to a first embodiment of the present disclosure. FIG. 2 is a front view illustrating a configuration of a front-end circuit according to the first embodiment of the present disclosure. Here, the front view is a view where a third side surface of an insulating substrate is taken as the front side.

As illustrated in FIG. 1, a high-frequency module 10 includes a low-frequency side front-end circuit 21, a high-frequency side front-end circuit 22, and a plurality of antennas ANT1 and ANT2. The low-frequency side front-end circuit 21 corresponds to "first front-end circuit" of the present disclosure, and the high-frequency side front-end circuit 22 corresponds to "second front-end circuit" of the present disclosure.

The high-frequency module 10 carries out transmission and reception in a first communication band and a second communication band having utilizing frequency ranges different from one another. Note that the high-frequency module 10 can carry out transmission and reception in a communication band that is not the first communication band or the second communication band. The frequency range of the first communication band is lower than the frequency range of the second communication band. The high-frequency module 10 is especially effective in cases where frequencies of harmonic signals of transmitting signals in the first communication band are close to or overlap the frequency range of receiving signals in the second communication band.

The front-end circuit 21 includes a transmitter circuit 311, a demultiplexer circuit 312, and a receiver circuit 313. The transmitter circuit 311 includes a power amplifier 411 and a matching circuit 412. An input terminal of the power amplifier 411 is connected to a non-illustrated RFIC of the first communication band. An output terminal of the power amplifier 411 is connected to the demultiplexer circuit 312 with the matching circuit 412 interposed therebetween.

The demultiplexer circuit 312 is composed of a switch circuit or a duplexer (circuitry composed of an inductor, a capacitor, and the like). The demultiplexer circuit 312 is connected to the transmitter circuit 311, the receiver circuit 313, and the antenna ANT1. The demultiplexer circuit 312 outputs transmitting signals from the transmitter circuit 311 to the antenna ANT1 and outputs receiving signals from the antenna ANT1 to the receiver circuit 313.

The receiver circuit 313 includes a matching circuit 413 and a low-noise amplifier 414. An input terminal of the low-noise amplifier 414 is connected to the demultiplexer circuit 312 with the matching circuit 413 interposed therebetween. An output terminal of the low-noise amplifier 414 is connected to a non-illustrated RFIC of the first communication band.

The front-end circuit 22 includes a transmitter circuit 321, a demultiplexer circuit 322, and a receiver circuit 323. The transmitter circuit 321 includes a power amplifier 421 and a matching circuit 422. An input terminal of the power amplifier 421 is connected to a non-illustrated RFIC of the second communication band. An output terminal of the power amplifier 421 is connected to the demultiplexer circuit 322 with the matching circuit 422 interposed therebetween.

The demultiplexer circuit 322 is composed of a switch circuit or a duplexer (circuitry composed of an inductor, a capacitor, and the like). The demultiplexer circuit 322 is connected to the transmitter circuit 321, the receiver circuit 323, and the antenna ANT2. The demultiplexer circuit 322 outputs transmitting signals from the transmitter circuit 321 to the antenna ANT2 and outputs receiving signals from the antenna ANT2 to the receiver circuit 323.

The receiver circuit 323 includes a matching circuit 423 and a low-noise amplifier 424. An input terminal of the low-noise amplifier 424 is connected to the demultiplexer circuit 322 with the matching circuit 423 interposed therebetween. An output terminal of the low-noise amplifier 424 is connected to a non-illustrated RFIC of the second communication band.

As illustrated in FIG. 2, the front-end circuit 21 includes a shielding conductor 100, an insulating substrate 201, and a moulding resin 202. The front-end circuit 21 includes a power amplifier 411 that serves as a transmitter circuit device and passive devices 4121 and 4122. The passive devices 4121 and 4122 are devices constituting the matching circuit 412. Note that other transmitter circuit devices constituting the transmitter circuit 311 are not illustrated in the drawing.

The front-end circuit 21 includes a passive device 3131 that serves as a receiver circuit device. Note that other receiver circuit devices constituting the receiver circuit 313 are not illustrated in the drawing.

The insulating substrate 201 includes, for example, a multilayer structure in which a plurality of dielectric layers are stacked on top of each other and each of the plurality of dielectric layer is provided with a conductor pattern formed thereon. The insulating substrate 201 is a cuboid and has a first side surface 2011, a top surface 2012, a bottom surface 2013, and a second side surface 2014. Of the four side surfaces of the cuboid insulating substrate 201, the first side surface 2011 and the second side surface 2014 are two side surfaces that oppose one another. The first side surface 2011 and the second side surface 2014 are orthogonal to the top surface 2012 and the bottom surface 2013. Further, the insulating substrate 201 includes a third side surface and a fourth side surface that are two side surfaces other than the first side surface 2011 and the second side surface 2014 of the four side surfaces and that are orthogonal to the top surface 2012, the bottom surface 2013, the first side surface 2011, and the second side surface 2014. In front view of the front-end circuit 21, the third side surface is positioned at the front side. The third side surface faces the fourth side surface and is in contact with the first side surface at the right direction and the second side surface at the left direction. Note that the insulating substrate 201 is not necessarily a perfect cuboid and may be any shape so long as the shape includes the first side surface 2011, the top surface 2012, the bottom surface 2013, and the second side surface 2014.

The power amplifier 411 and the passive devices 4121 and 4122 are mounted on the top surface 2012 of the insulating substrate 201. Further, in this case, the power amplifier 411 and the passive devices 4121 and 4122 are mounted closer to the first side surface 2011 than the second side surface 2014 in a region of the top surface 2012. In other words, in a plan view of the front-end circuit 21, the power amplifier 411 and the passive devices 4121 and 4122 are mounted in a transmitter circuit region Retx close to the first side surface 2011. Note that the non-illustrated other transmitter circuit devices constituting the transmitter circuit 311 are also mounted in the transmitter circuit region Retx.

The passive device 3131 is mounted on the top surface 2012 of the insulating substrate 201. Further, in this case, the passive device 3131 is mounted on the top surface 2012 between the transmitter circuit region Retx and the second side surface 2014. In other words, in a plan view of the insulating substrate 201, the passive device 3131 is mounted in a receiver circuit region Rerx adjacent to the transmitter circuit region Retx and close to the second side surface 2014. Note that other receiver circuit devices constituting the non-illustrated receiver circuit 313 are also mounted in the receiver circuit region Rerx.

The moulding resin 202 is formed in such a manner as to cover the entire area of the top surface 2012 of the insulating substrate 201. The moulding resin 202 has an insulating property. The moulding resin 202 covers all the transmitter circuit devices and all the receiver circuit devices. The moulding resin 202 is approximately a cuboid and has a first side surface 2021, a top surface 2022, a second side surface 2024, a third side surface, and a fourth side surface. The first side surface 2021 of the moulding resin 202 and the first side surface 2011 of the insulating substrate 201 are positioned on the same plane. The second side surface 2024 of the moulding resin and the second side surface 2014 of the insulating substrate 201 are positioned on the same plane. The third side surface of the moulding resin and the third side surface of the insulating substrate 201 are positioned on the same plane. The fourth side surface of the moulding resin and the fourth side surface of the insulating substrate 201 are positioned on the same plane. The top surface 2022 of the moulding resin 202 faces the top surface 2012 of the insulating substrate 201.

The shielding conductor 100 includes a top surface side conductor 101 and a first side surface side conductor 102. The top surface side conductor 101 and the first side surface side conductor 102 are connected. The top surface side conductor 101 has a shape such that, in a plan view of the front-end circuit 21, the top surface side conductor 101 covers the entire area of the transmitter circuit region Retx and does not cover the receiver circuit region Rerx. That is, the top surface side conductor 101 has a shape such that, in a plan view of the front-end circuit 21, the top surface side conductor 101 overlaps with the entire area of the transmitter circuit region Retx and does not overlap the receiver circuit region Rerx. The first side surface side conductor 102 has a shape such that the first side surface side conductor 102 covers the entire area of the first side surface 2021 of the moulding resin 202 connected to the first side surface 2011 of the insulating substrate 201 and a part of the first side surface 2011 of the insulating substrate 201. The first side surface side conductor 102 does not cover the other side surfaces of the moulding resin 202 or the other side surfaces of the insulating substrate 201. That is, the first side surface side conductor 102 has a shape such that, in a side view, the first side surface side conductor 102 overlaps with the entire area of the first side surface 2021 and a part of the first side surface 2011 of the insulating substrate 201. The first side surface side conductor 102 does not overlap, in a side view, the other side surfaces of the moulding resin 202 or the other side surfaces of the insulating substrate 201. Here, the side view means a case where the front-end circuit 21 is viewed from the first side surface side or the second side surface side.

Employing such configuration enables to shield unwanted signals radiated from the transmitter circuit devices (for example, harmonic signals of transmitting signals in the first communication band and the like) with the top surface side conductor 101 and the first side surface side conductor 102, thereby preventing external leakage. Accordingly, even in a case where another front-end circuit or the like is arranged close to the front-end circuit 21, leakage of such unwanted signals to another front-end circuit or the like can be suppressed. Further, since the receiver circuit region Rerx is not covered by the shielding conductor 100, unwanted coupling between the receiver circuit devices and the shielding conductor 100 can be suppressed.

Further, using the configuration of the front-end circuit 21 enables to arrange the receiver circuit devices close to the second side surface 2014 of the insulating substrate 201. In other words, as illustrated in FIG. 2, compared with a distance W1 between the first side surface 2011 and the transmitter circuit device, a distance W2 between the second side surface 2014 and the receiver circuit device can be reduced (W2<W1). In this way, the transmitter circuit devices and the receiver circuit devices can be mounted by efficiently using the top surface 2012 of the insulating substrate 201. This enables to form the front-end circuit 21 with a smaller size.

Figure 3:
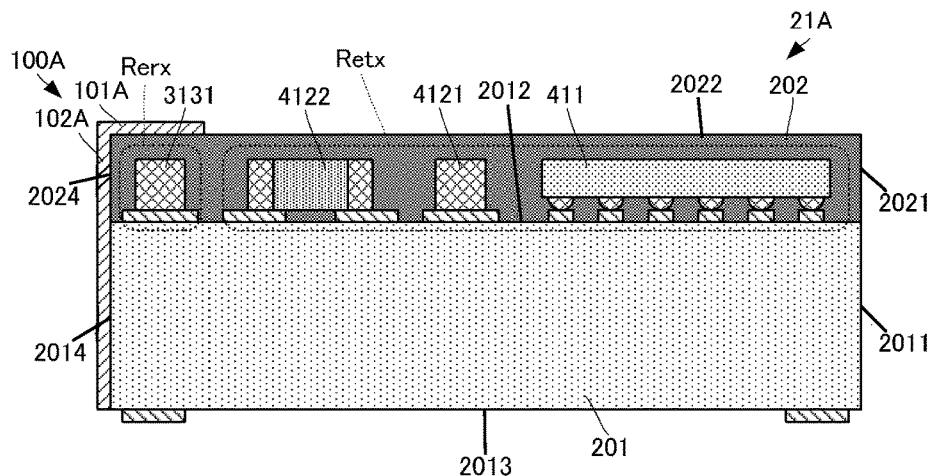
FIG. 3 is a front view illustrating a configuration of a front-end circuit according to a second embodiment of the present disclosure.

Next, a front-end circuit according to a second embodiment of the present disclosure is described with reference to the drawings. FIG. 3 is a front view illustrating a configuration of the front-end circuit according to the second embodiment of the present disclosure. Here, the front view is a view where the third side surface of the insulating substrate is taken as the front side.

A front-end circuit 21A of the present embodiment is different from the front-end circuit 21 according to the first embodiment in that a shielding conductor 100A is placed at a different position. Other configurations of the front-end circuit 21A are the same as those of the front-end circuit 21 according to the first embodiment, and descriptions regarding the same parts are omitted.

The shielding conductor 100A includes a top surface side conductor 101A and a second side surface side conductor 102A. The top surface side conductor 101A and the second side surface side conductor 102A are connected. The top surface side conductor 101A has a shape such that, in a plan view of the front-end circuit 21A, the top surface side conductor 101A covers the entire area of the receiver circuit region Rerx and does not cover the transmitter circuit region Retx. The second side surface side conductor 102A has a shape such that the second side surface side conductor 102A covers the entire area of the second side surface 2024 of the moulding resin 202 connected to the second side surface 2014 of the insulating substrate 201 and a part of the second side surface 2014 of the insulating substrate 201. The second side surface side conductor 102A does not cover the other side surfaces of the moulding resin 202 or the other side surfaces of the insulating substrate 201.

Employing such configuration enables to shield unwanted signals from outside with the top surface side conductor 101A and the second side surface side conductor 102A, thereby preventing reaching of the unwanted signals from outside to the receiver circuit devices. Accordingly, even in a case where another front-end circuit or the like is arranged close to the front-end circuit 21A, propagation of such unwanted signals to the receiver circuit of the front-end circuit 21A can be suppressed. Further, since the transmitter circuit region Retx is not covered by the shielding conductor 100A, unwanted coupling between the transmitter circuit devices and the shielding conductor 100A can be suppressed.

Figure 4:
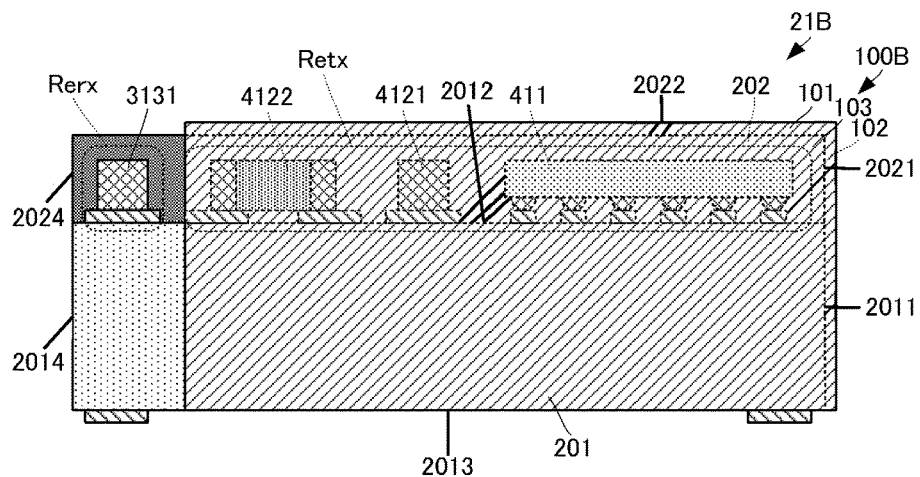
FIG. 4 is a front view illustrating a configuration of a front-end circuit according to a third embodiment of the present disclosure.

Next, a front-end circuit according to a third embodiment of the present disclosure is described with reference to the drawings. FIG. 4 is a front view illustrating a configuration of the front-end circuit according to the third embodiment of the present disclosure. Here, the front view is a view where the third side surface of the insulating substrate is taken as the front side.

A front-end circuit 21B of the present embodiment is different from the front-end circuit 21 according to the first embodiment in that a shielding conductor 100B has a different shape. Other configurations of the front-end circuit 21B are the same as those of the front-end circuit 21 according to the first embodiment, and descriptions regarding the same parts are omitted.

The shielding conductor 100B includes a top surface side conductor 101, a first side surface side conductor 102, and a third side surface side conductor 103. The top surface side conductor 101, the first side surface side conductor 102, and the third side surface side conductor 103 are connected.

The third side surface side conductor 103 has a shape that covers a part overlapping with the transmitter circuit region Retx in the third side surface of the moulding resin 202 connected to the third side surface of the insulating substrate 201. The third side surface side conductor 103 extends from an end portion of the third side surface of the insulating substrate 201 on the top surface 2012 side to an end portion on the bottom surface 2013 side.

Employing such configuration further prevents external leakage of unwanted signals radiated from the transmitter circuit devices. Accordingly, even in a case where another front-end circuit or the like is arranged close to the front-end circuit 21B, leakage of such unwanted signals to another front-end circuit or the like can be suppressed.

Note that, in the front-end circuit 21B, the embodiment is illustrated where the shielding conductor 100B is not formed on the fourth side surface of the insulating substrate 201 and the fourth side surface (facing the third side surface and being a surface vertical to the top surface of the front-end circuit 21B) of the moulding resin 202. Alternatively, the shielding conductor 100B may also be formed on the fourth side surface. This further prevents external leakage of unwanted signals radiated from the transmitter circuit devices.

Figure 5:
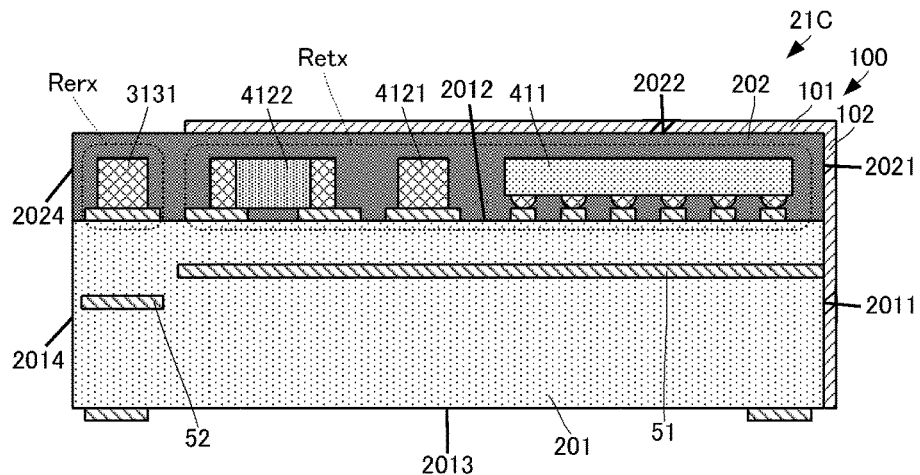
FIG. 5 is a front view illustrating a configuration of a front-end circuit according to a fourth embodiment of the present disclosure.

Next, a front-end circuit according to a fourth embodiment of the present disclosure is described with reference to the drawings. FIG. 5 is a front view illustrating a configuration of the front-end circuit according to the fourth embodiment of the present disclosure. Here, the front view is a view where the third side surface of the insulating substrate is taken as the front side.

A front-end circuit 21C of the present embodiment is different from the front-end circuit 21 according to the first embodiment in that a transmitter side ground conductor 51 and a receiver side ground conductor 52 are included. Other configurations of the front-end circuit 21C are the same as those of the front-end circuit 21 according to the first embodiment, and descriptions regarding the same parts are omitted.

The transmitter side ground conductor 51 and the receiver side ground conductor 52 are each formed inside the insulating substrate 201.

In a plan view of the front-end circuit 21C, the transmitter side ground conductor 51 overlaps with the transmitter circuit region Retx and does not overlap with the receiver circuit region Rerx or the receiver side ground conductor 52. The transmitter side ground conductor 51 is not connected to the receiver side ground conductor 52 in the insulating substrate 201. The transmitter side ground conductor 51 is connected to the first side surface side conductor 102 of the shielding conductor 100.

In a plan view of the front-end circuit 21C, the receiver side ground conductor 52 overlaps with the receiver circuit region Rerx and does not overlap with the transmitter circuit region Retx.

Employing such configuration enables the transmitter side ground conductor 51 to shield radiation of unwanted signals from the backside of the transmitter circuit devices. This further prevents external leakage of unwanted signals radiated from the transmitter circuit devices.

Further, the transmitter side ground conductor 51 and the receiver side ground conductor 52 do not overlap and are not connected. This suppresses coupling between the transmitter circuit devices and the receiver circuit devices via the ground conductors and improves isolation between the transmitter circuit and the receiver circuit of the front-end circuit 21C.

Figure 6:
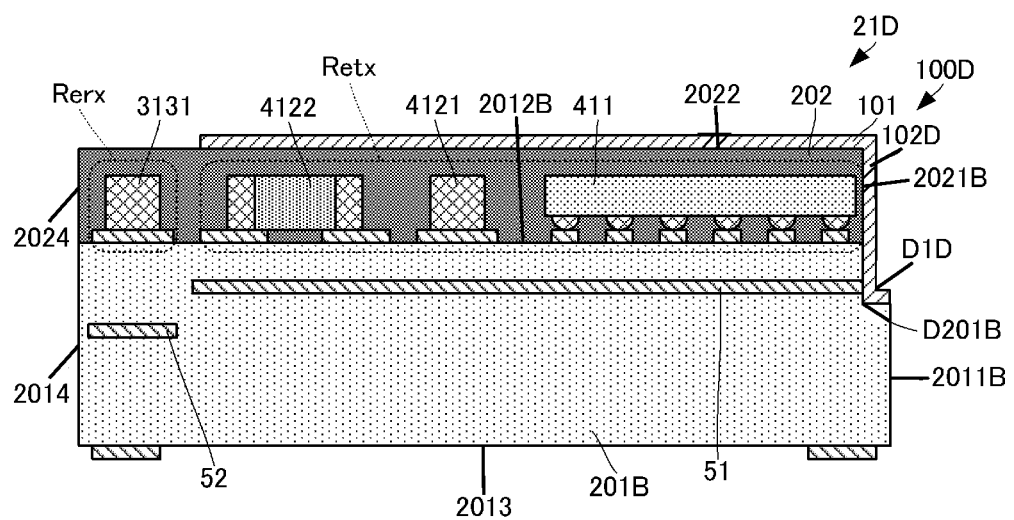
FIG. 6 is a front view illustrating a configuration of a front-end circuit according to a fifth embodiment of the present disclosure.

Next, a front-end circuit according to a fifth embodiment of the present disclosure is described with reference to the drawings. FIG. 6 is a front view illustrating a configuration of the front-end circuit according to the fifth embodiment of the present disclosure. Here, the front view is a view where the third side surface of the insulating substrate is taken as the front side.

A front-end circuit 21D of the present embodiment is different from the front-end circuit 21C according to the fourth embodiment in that an insulating substrate 201B and a shielding conductor 100D have different shapes. Other configurations of the front-end circuit 21D are the same as those of the front-end circuit 21C according to the fourth embodiment, and descriptions regarding the same parts are omitted.

The insulating substrate 201B has a depression D201B on a first side surface 2011B. According to this configuration, the size of a top surface 2012B of the insulating substrate 201B is smaller than the size of the bottom surface 2013.

A first side surface side conductor 102D of the shielding conductor 100D abuts the depression D201B of the insulating substrate 201B along the depression D201B and has a depression D1D. The transmitter side ground conductor 51 is connected to the first side surface side conductor 102D at this part of the depression D1D.

Employing such configuration enables to ensure placement of the first side surface side conductor 102D of the shielding conductor 100D in the insulating substrate 201B and the moulding resin 202.

Figure 7:
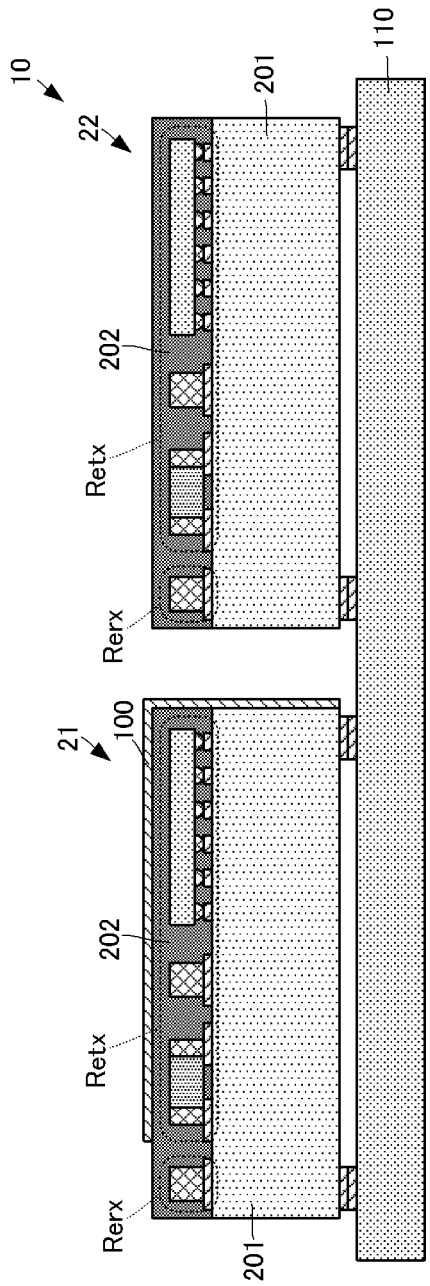
FIG. 7 is a front view illustrating a configuration of a high-frequency module according to a sixth embodiment of the present disclosure.

Next, a high-frequency module according to a sixth embodiment of the present disclosure is described with reference to the drawings. FIG. 7 is a front view illustrating a configuration of the high-frequency module according to the sixth embodiment of the present disclosure. Here, the front view is a view where a third side surface of an insulating substrate for a plurality of front-end circuits in the high-frequency module is taken as the front side.

The circuit configuration of a high-frequency module 10 is the same as the one illustrated in FIG. 1 of the first embodiment.

The high-frequency module 10 includes front-end circuits 21 and 22 and a base substrate 110. The front-end circuit 21 carries out transmission and reception in the first communication band. The front-end circuit 21 corresponds to "first front-end unit" of the present disclosure. The front-end circuit 22 carries out transmission and reception in the second communication band. The front-end circuit 22 corresponds to "second front-end unit" of the present disclosure.

The front-end circuit 21 has a structure illustrated in the first embodiment. The front-end circuit 22 has a structure illustrated in the first embodiment without the shielding conductor 100.

The front-end circuit 21 and the front-end circuit 22 are mounted on the top surface of the base substrate 110 in such a manner as to be adjacent to one another. The first side surface of the front-end circuit 21 on which the shielding conductor 100 is arranged is on the front-end circuit 22 side.

With such configuration, even in a case where the front-end circuit 21 and the front-end circuit 22 are arranged close to one another, the shielding conductor 100 shields harmonic signals of transmitting signals from the front-end circuit 21 in the first communication band. This prevents the harmonic signals from propagating to the front-end circuit 22. Accordingly, degradation of transmission and reception characteristics of the front-end circuit 22 can be suppressed. For example, even in a case where the frequency range of receiving signals in the second communication band is close to or overlap with frequencies of harmonic signals of transmitting signals in the first communication band, the degradation of reception sensitivity and S/N of the front-end circuit 22 can be suppressed.

Figure 8:
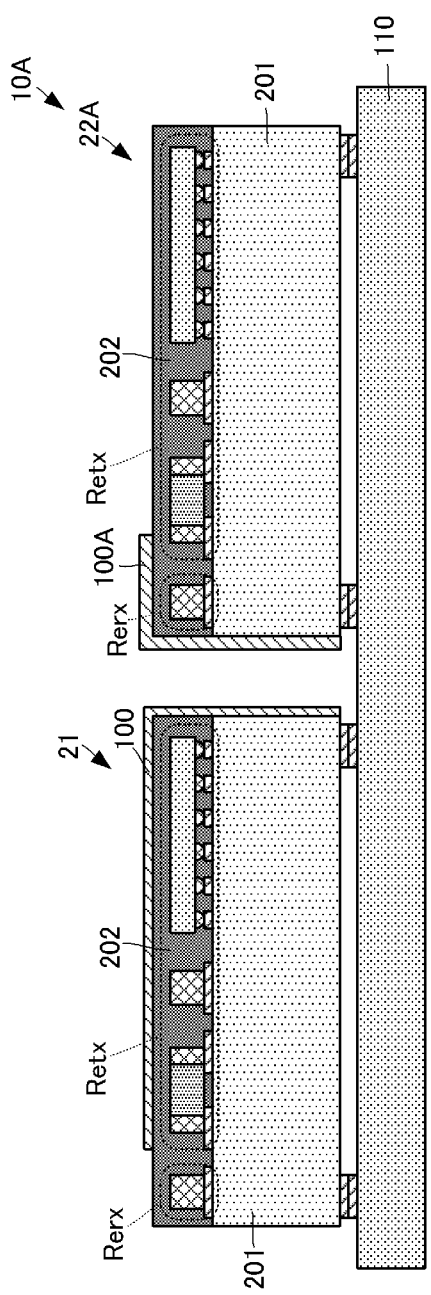
FIG. 8 is a front view illustrating a configuration of a high-frequency module according to a seventh embodiment of the present disclosure.

Next, a high-frequency module according to a seventh embodiment of the present disclosure is described with reference to the drawings. FIG. 8 is a front view illustrating a configuration of the high-frequency module according to the seventh embodiment of the present disclosure. Here, the front view is a view where the third side surface of the insulating substrate in a plurality of front-end circuits in the high-frequency module is taken as the front side.

A high-frequency module 10A of the present embodiment is different from the high-frequency module 10 according to the sixth embodiment in that a front-end circuit 22A has a different configuration.

The front-end circuit 22A includes a shielding conductor 100A and has the same structure as the front-end circuit 21A according to the second embodiment.

With such configuration, harmonic signals of transmitting signals in the first communication band are shielded with the shielding conductor 100 of the front-end circuit 21 and the shielding conductor 100B of the front-end circuit 22A. This further enables to suppress the degradation of transmission and reception characteristics of the front-end circuit 22A.

Figure 9:
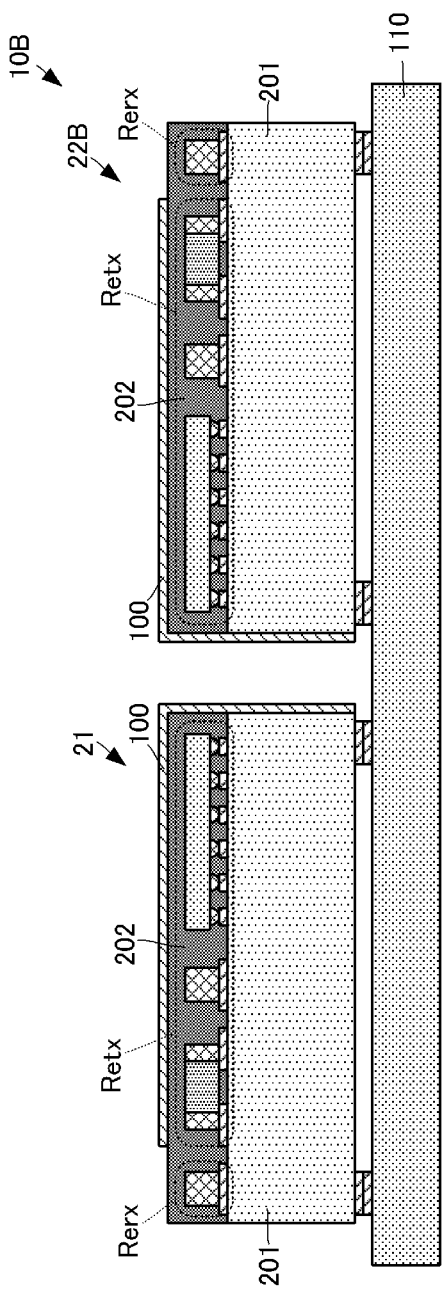
FIG. 9 is a front view illustrating a configuration of a high-frequency module according to an eighth embodiment of the present disclosure.

Next, a high-frequency module according to an eighth embodiment of the present disclosure is described with reference to the drawings. FIG. 9 is a front view illustrating a configuration of the high-frequency module according to the eighth embodiment of the present disclosure. Here, the front view is a view where the third side surface of the insulating substrate in a plurality of front-end circuits in the high-frequency module is taken as the front side.

A high-frequency module 10B of the present embodiment is different from the high-frequency module 10 according to the sixth embodiment in that a front-end circuit 22B has a different configuration.

The front-end circuit 22B includes the shielding conductor 100 and has the same structure as the front-end circuit 21. The first side surface of the front-end circuit 22B on which the shielding conductor 100 is arranged is on the front-end circuit 21 side.

Even with such configuration, the degradation of transmission and reception characteristics of the front-end circuit 22B can be further suppressed. Further, the receiver circuit devices in the front-end circuit 22B are separated from the front-end circuit 21. Thus, the degradation of reception sensitivity and S/N of the front-end circuit 22B can be further suppressed.

Figure 10:
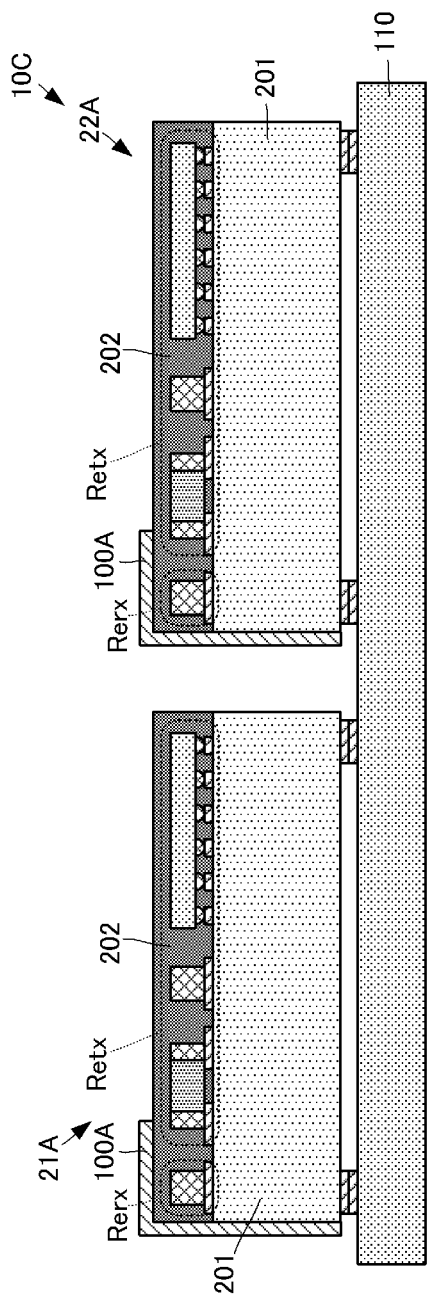
FIG. 10 is a front view illustrating a configuration of a high-frequency module according to a ninth embodiment of the present disclosure.

Next, a high-frequency module according to a ninth embodiment of the present disclosure is described with reference to the drawings. FIG. 10 is a front view illustrating a configuration of the high-frequency module according to the ninth embodiment of the present disclosure. Here, the front view is a view where the third side surface of the insulating substrate in a plurality of front-end circuits in the high-frequency module is taken as the front side.

The high-frequency module 10C of the present embodiment is different from the high-frequency module 10A according to the seventh embodiment in that a front-end circuit 21A has a different configuration.

The front-end circuit 21A has the same structure as the front-end circuit 22A.

With such configuration, similar actions and effects as in the high-frequency module 10A are obtained, and the degradation of reception sensitivities and S/Ns of the front-end circuits 21A and 22A are further suppressed.

Figure 11:
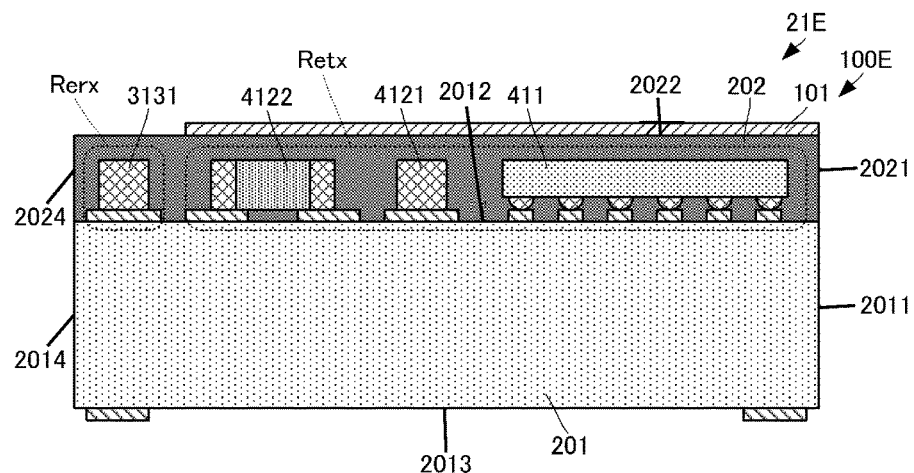
FIG. 11 is a front view illustrating another configuration of the front-end circuit according to the first embodiment of the present disclosure.
Figure 12:
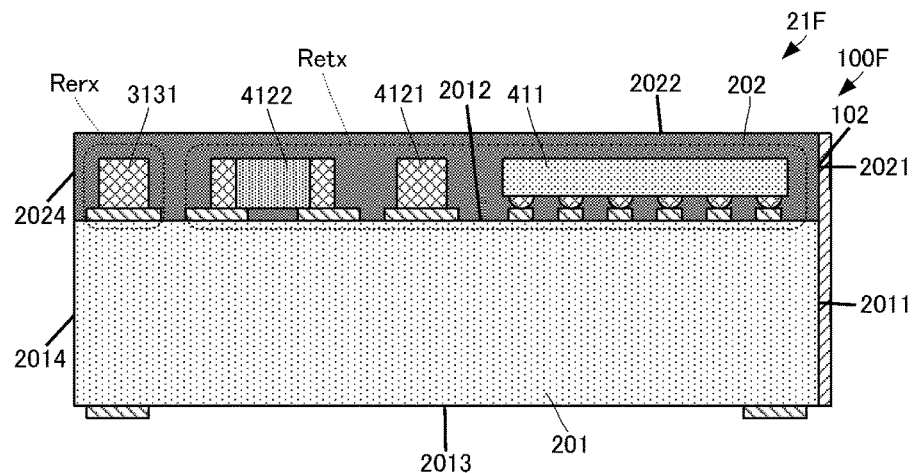
FIG. 12 is a front view illustrating another configuration of the front-end circuit according to the first embodiment of the present disclosure.

Note that the following structure may be applicable to the foregoing front-end circuit according to the first embodiment. FIG. 11 and FIG. 12 are front views illustrating other configurations of the front-end circuit according to the first embodiment of the present disclosure. Here, the front view is a view where the third side surface of the insulating substrate is taken as the front side.

As illustrated in FIG. 11, a front-end circuit 21E is different from the front-end circuit 21 according to the first embodiment in that a shielding conductor 100E has a different configuration. Other configurations of the front-end circuit 21E are the same as those of the front-end circuit 21, and descriptions regarding the same parts are omitted.

The shielding conductor 100E includes only the top surface side conductor 101. In other words, the shielding conductor 100E does not include the first side surface side conductor.

Employing such configuration enables to shield unwanted signals radiated from the transmitter circuit devices (for example, harmonic signals of transmitting signals in the first communication band and the like) with the top surface side conductor 101, thereby preventing external leakage. Further, since the receiver circuit region Rerx is not covered by the shielding conductor 101E, unwanted coupling between the receiver circuit devices and the shielding conductor 101E can be suppressed.

As illustrated in FIG. 12, a front-end circuit 21F is different from the front-end circuit 21 according to the first embodiment in that a shielding conductor 100F has a different configuration. Other configurations of the front-end circuit 21F are the same as those of the front-end circuit 21, and descriptions regarding the same parts are omitted.

The shielding conductor 100F includes only the first side surface side conductor 102. In other words, the shielding conductor 100F does not include the top surface side conductor.

Employing such configuration enables to shield unwanted signals radiated from the transmitter circuit devices (for example, harmonic signals of transmitting signals in the first communication band and the like) with the first side surface side conductor 102, thereby preventing external leakage. Further, since the receiver circuit region Rerx is not covered by the shielding conductor 100F, unwanted coupling between the receiver circuit devices and the shielding conductor 100F can be suppressed.

Figure 13:
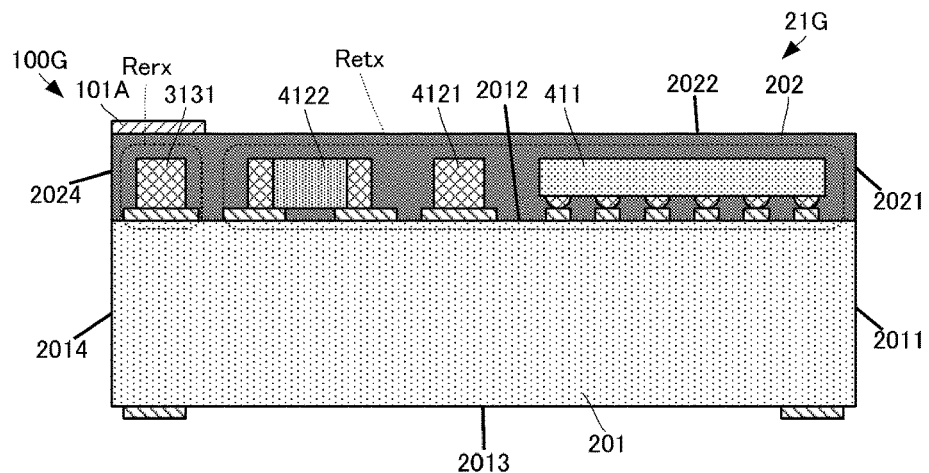
FIG. 13 is a front view illustrating another configuration of the front-end circuit according to the second embodiment of the present disclosure.
Figure 14:
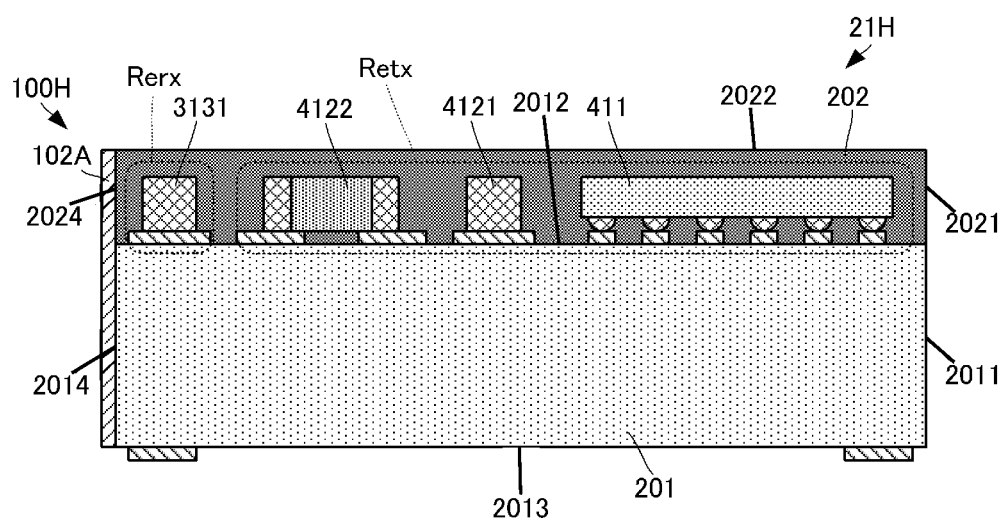
FIG. 14 is a front view illustrating another configuration of the front-end circuit according to the second embodiment of the present disclosure.

Further, the following structure may be applicable to the foregoing front-end circuit according to the second embodiment. FIG. 13 and FIG. 14 are front views illustrating other configurations of the front-end circuits according to the second embodiment of the present disclosure. Here, the front view is a view where the third side surface of the insulating substrate is taken as the front side.

As illustrated in FIG. 13, a front-end circuit 21G is different from the front-end circuit 21A according to the second embodiment in that a shielding conductor 100G has a different configuration. Other configurations of the front-end circuit 21G are the same as those of the front-end circuit 21A, and descriptions regarding the same parts are omitted.

The shielding conductor 100G includes only the top surface side conductor 101A. In other words, the shielding conductor 100G does not include the second side surface side conductor.

Employing such configuration enables to shield unwanted signals from outside with the top surface side conductor 101A, thereby preventing reaching of the unwanted signals to the receiver circuit devices. Further, since the transmitter circuit region Retx is not covered by the shielding conductor 100G, unwanted coupling between the transmitter circuit devices and the shielding conductor 100G can be suppressed.

As illustrated in FIG. 14, a front-end circuit 21H is different from the front-end circuit 21A according to the second embodiment in that a shielding conductor 100H has a different configuration. Other configurations of the front-end circuit 21H are the same as those of the front-end circuit 21A, and descriptions regarding the same parts are omitted.

The shielding conductor 100H includes only the second side surface side conductor 102A. In other words, the shielding conductor 100G does not include the top surface side conductor 101A.

Employing such configuration enables to shield unwanted signals from outside with the second side surface side conductor 102A, thereby preventing reaching of the unwanted signals to the receiver circuit devices. Further, since the transmitter circuit region Retx is not covered by the shielding conductor 100H, unwanted coupling between the transmitter circuit devices and the shielding conductor 100H can be suppressed.

Further, the configurations of the front-end circuits and the configurations of the high-frequency modules of the foregoing embodiments may be arbitrarily combined, and depending on the combination, the actions and effects of the front-end circuits and the high-frequency modules of the foregoing embodiments may be obtained.

Further, the moulding resin may be omitted in each of the foregoing embodiments.

10, 10A, 10B, 10C High-frequency module
21, 21A, 21B, 21C, 22, 22A, 21E, 21F, 21G, 21H Front-end circuit
51 Transmitter side ground conductor
52 Receiver side ground conductor
100, 100A, 100B, 100D, 100E, 100F, 100G, 100H Shielding conductor
101, 101A Top surface side conductor
102, 102D First side surface side conductor
102A Second side surface side conductor
110 Base substrate
201, 201B Insulating substrate
202 Moulding resin
311 Transmitter circuit
312 Demultiplexer circuit
313 Receiver circuit
411 Power amplifier
412 Matching circuit
413 Matching circuit
414, 424 Low-noise amplifier
2011, 2011B, 2021 First side surface
2012, 2012B, 2022 Top surface
2013 Bottom surface
2014, 2024 Second side surface
3131 Passive device
4121, 4122 Passive device
ANT1, ANT2 Antenna
D1D, D201B Depression
Retx Transmitter circuit region
Rerx Receiver circuit region

The invention claimed is:

1. A front-end circuit including a transmitter circuit and a receiver circuit, comprising:
  an insulating substrate having a top surface, a bottom surface, a first side surface, and a second side surface;
  a transmitter circuit device mounted on the top surface of the insulating substrate, the transmitter circuit device constituting a part of the transmitter circuit;
  a receiver circuit device mounted on the top surface of the insulating substrate, the receiver circuit device constituting a part of the receiver circuit; and
  a shielding conductor covering a part of the insulating substrate at a top surface side, wherein
  in the top surface, a transmitter circuit region where the transmitter circuit device is mounted is arranged at a side closer to the first side surface than the second side surface, in the top surface, a receiver circuit region where the receiver circuit device is mounted is arranged between the transmitter circuit region and the second side surface, and the shielding conductor
includes at least one of a top surface side conductor overlapping with the transmitter circuit region in a plan view and a first side surface side conductor overlapping with the first side surface side of the transmitter circuit region in a side view, and
has a shape not overlapping with the receiver circuit region in a plan view and not overlapping with a second side surface side of the receiver circuit region in a side view.

2. The front-end circuit according to claim 1, wherein the shielding conductor includes both the top surface side conductor and the first side surface side conductor.

3. The front-end circuit according to claim 1, wherein the insulating substrate includes a third side surface and a fourth side surface, wherein the third side surface and the fourth side surface are orthogonal to the first side surface and the second side surface, respectively, and the shielding conductor
includes at least one of a third side surface side conductor covering a third side surface side of the transmitter circuit region and a fourth side surface side conductor covering a fourth side surface side of the transmitter circuit region.

4. The front-end circuit according to claim 1, wherein a part of the transmitter circuit is constituted by a transmitter circuit conductor pattern provided on the insulating substrate,
a part of the receiver circuit is constituted by a receiver circuit conductor pattern provided on the insulating substrate,
the transmitter circuit conductor pattern is provided inside the insulating substrate and includes a transmitter side ground conductor to be connected to the transmitter circuit device,
the receiver circuit conductor pattern is provided inside the insulating substrate and includes a receiver side ground conductor to be connected to the receiver circuit device, and
the transmitter side ground conductor
overlaps with the transmitter circuit region and does not overlap with the receiver circuit region or the receiver side ground conductor in a plan view, and
is not connected to the receiver side ground conductor within the insulating substrate, and
is connected to the shielding conductor.

5. The front-end circuit according to claim 1, wherein the insulating substrate includes a depression on the first side surface side, and
the shielding conductor is arranged in such a manner as to abut the depression.

6. A front-end circuit including a transmitter circuit and a receiver circuit, comprising:
an insulating substrate having a top surface, a bottom surface, a first side surface, and a second side surface;
a transmitter circuit device mounted on the top surface of the insulating substrate, the transmitter circuit device constituting a part of the transmitter circuit;
a receiver circuit device mounted on the top surface of the insulating substrate, the receiver circuit device constituting a part of the receiver circuit; and
a shielding conductor covering a part of the insulating substrate at a top surface side, wherein in the top surface, a transmitter circuit region where the transmitter circuit device is mounted is arranged at a side closer to the first side surface than the second side surface,
in the top surface, a receiver circuit region where the receiver circuit device is mounted is arranged between the transmitter circuit region and the second side surface, and
the shielding conductor
includes at least one of a top surface side conductor overlapping with the receiver circuit region in a plan view and a second side surface side conductor overlapping with a second side surface side of the receiver circuit region in a side view, and
has a shape not overlapping with the transmitter circuit region in a plan view and not overlapping with the first side surface side of the transmitter circuit region in a side view.

7. The front-end circuit according to claim 6, wherein the shielding conductor
includes both the top surface side conductor and the second side surface side conductor.

8. The front-end circuit according to claim 6, wherein the insulating substrate includes a third side surface and a fourth side surface, wherein the third side surface and the fourth side surface are orthogonal to the first side surface and the second side surface, respectively, and the shielding conductor
includes at least one of a third side surface side conductor covering a third side surface side of the receiver circuit region and a fourth side surface side conductor covering a fourth side surface side of the receiver circuit region.

9. The front-end circuit according to claim 6, wherein the insulating substrate includes a depression on the second side surface side, and
the shielding conductor is arranged in such a manner as to abut the depression.

10. A high-frequency module performing transmission and reception in a first communication band and a second communication band, the second communication band having a certain communication frequency range, the first communication band having a communication frequency range lower than the communication frequency range of the second communication band, the high-frequency module comprising:
a first front-end unit performing transmission and reception in the first communication band;
a second front-end unit performing transmission and reception in the second communication band; and
a base substrate having the first front-end unit and the second front-end unit mounted in such a manner as to be adjacent to one another, wherein
the first front-end unit includes the front-end circuit according to claim 1.

11. The high-frequency module according to claim 10, wherein
the second front-end unit includes a front-end circuit,
wherein the front-end circuit includes a transmitter circuit and a receiver circuit, and comprises:
an insulating substrate having a top surface, a bottom surface, a first side surface, and a second side surface;
a transmitter circuit device mounted on the top surface of the insulating substrate, the transmitter circuit device constituting a part of the transmitter circuit;

a receiver circuit device mounted on the top surface of the insulating substrate, the receiver circuit device constituting a part of the receiver circuit; and a shielding conductor covering a part of the insulating substrate at a top surface side, wherein in the top surface, a transmitter circuit region where the transmitter circuit device is mounted is arranged at a side closer to the first side surface than the second side surface, in the top surface, a receiver circuit region where the receiver circuit device is mounted is arranged between the transmitter circuit region and the second side surface, and the shielding conductor includes at least one of a top surface side conductor overlapping with the receiver circuit region in a plan view and a second side surface side conductor overlapping with a second side surface side of the receiver circuit region in a side view, and has a shape not overlapping with the transmitter circuit region in a plan view and not overlapping with the first side surface side of the transmitter circuit region in a side view.

12. The high-frequency module according to claim 10, wherein the second front-end unit includes a front-end circuit, and a first side surface of a front-end circuit constituting the first front-end unit faces a first side surface of a front-end circuit constituting the second front-end unit, wherein the front-end circuit includes a transmitter circuit and a receiver circuit, and comprises:

an insulating substrate having a top surface, a bottom surface, a first side surface, and a second side surface;

a transmitter circuit device mounted on the top surface of the insulating substrate, the transmitter circuit device constituting a part of the transmitter circuit;

a receiver circuit device mounted on the top surface of the insulating substrate, the receiver circuit device constituting a part of the receiver circuit; and a shielding conductor covering a part of the insulating substrate at a top surface side, wherein in the top surface, a transmitter circuit region where the transmitter circuit device is mounted is arranged at a side closer to the first side surface than the second side surface, in the top surface, a receiver circuit region where the receiver circuit device is mounted is arranged between the transmitter circuit region and the second side surface, and the shielding conductor includes at least one of a top surface side conductor overlapping with the transmitter circuit region in a plan view and a first side surface side conductor overlapping with the first side surface side of the transmitter circuit region in a side view, and has a shape not overlapping with the receiver circuit region in a plan view and not overlapping with a second side surface side of the receiver circuit region in a side view.

13. A high-frequency module performing transmission and reception in a first communication band and a second communication band, the second communication band having a certain communication frequency range, the first communication band having a communication frequency range lower than the communication frequency range of the second communication band, the high-frequency module comprising:

a first front-end unit performing transmission and reception in the first communication band;

a second front-end unit performing transmission and reception in the second communication band; and a base substrate having the first front-end unit and the second front-end unit mounted in such a manner as to be adjacent to one another, wherein each of the first front-end unit and the second front-end unit includes the front-end circuit according to claim 1.

14. The front-end circuit according to claim 2, wherein the insulating substrate includes a third side surface and a fourth side surface, wherein the third side surface and the fourth side surface are orthogonal to the first side surface and the second side surface, respectively, and the shielding conductor includes at least one of a third side surface side conductor covering a third side surface side of the transmitter circuit region and a fourth side surface side conductor covering a fourth side surface side of the transmitter circuit region.

15. The front-end circuit according to claim 2, wherein a part of the transmitter circuit is constituted by a transmitter circuit conductor pattern provided on the insulating substrate, a part of the receiver circuit is constituted by a receiver circuit conductor pattern provided on the insulating substrate, the transmitter circuit conductor pattern is provided inside the insulating substrate and includes a transmitter side ground conductor to be connected to the transmitter circuit device, the receiver circuit conductor pattern is provided inside the insulating substrate and includes a receiver side ground conductor to be connected to the receiver circuit device, and the transmitter side ground conductor overlaps with the transmitter circuit region and does not overlap with the receiver circuit region or the receiver side ground conductor in a plan view, and is not connected to the receiver side ground conductor within the insulating substrate, and is connected to the shielding conductor.

16. The front-end circuit according to claim 3, wherein a part of the transmitter circuit is constituted by a transmitter circuit conductor pattern provided on the insulating substrate, a part of the receiver circuit is constituted by a receiver circuit conductor pattern provided on the insulating substrate, the transmitter circuit conductor pattern is provided inside the insulating substrate and includes a transmitter side ground conductor to be connected to the transmitter circuit device, the receiver circuit conductor pattern is provided inside the insulating substrate and includes a receiver side ground conductor to be connected to the receiver circuit device, and the transmitter side ground conductor overlaps with the transmitter circuit region and does not overlap with the receiver circuit region or the receiver side ground conductor in a plan view, and is not connected to the receiver side ground conductor within the insulating substrate, and is connected to the shielding conductor.

17. The front-end circuit according to claim 2, wherein the insulating substrate includes a depression on the first side surface side, and the shielding conductor is arranged in such a manner as to abut the depression.

18. The front-end circuit according to claim 3, wherein the insulating substrate includes a depression on the first side surface side, and
the shielding conductor is arranged in such a manner as to abut the depression.

19. The front-end circuit according to claim 4, wherein the insulating substrate includes a depression on the first side surface side, and
the shielding conductor is arranged in such a manner as to abut the depression.

20. The front-end circuit according to claim 7, wherein the insulating substrate includes a third side surface and a fourth side surface, wherein the third side surface and the fourth side surface are orthogonal to the first side surface and the second side surface, respectively, and
the shielding conductor
includes at least one of a third side surface side conductor covering a third side surface side of the receiver circuit region and a fourth side surface side conductor covering a fourth side surface side of the receiver circuit region.

\* \* \* \* \*